(12) United States Patent
Viswanathan et al.

(10) Patent No.: US 9,443,040 B2
(45) Date of Patent: Sep. 13, 2016

(54) METHOD OF FORMING HEMMING TOOL

(71) Applicant: Ford Global Technologies, LLC, Dearborn, MI (US)

(72) Inventors: Karthik Viswanathan, Novi, MI (US); Evangelos Liasi, Royal Oak, MI (US); Marc Foresi, Flat Rock, MI (US); Roger Petrey, Rochester Hills, MI (US); Joseph Haynes, Fairhaven, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 0 days.

(21) Appl. No.: 14/590,392

(22) Filed: Jan. 6, 2015

(65) Prior Publication Data

US 2016/0196361 A1    Jul. 7, 2016

(51) Int. Cl.
  *G06F 17/50* (2006.01)
  *B21D 39/02* (2006.01)
  *B23P 15/24* (2006.01)

(52) U.S. Cl.
  CPC ............. *G06F 17/50* (2013.01); *B21D 39/021* (2013.01); *B23P 15/24* (2013.01)

(58) Field of Classification Search
  CPC ... B21D 39/02; B21D 39/021; B21D 39/023
  USPC ...................................................... 76/107.1
  See application file for complete search history.

(56) References Cited

U.S. PATENT DOCUMENTS

| 6,766,206 B1 | 7/2004 | Jasuja et al. |
| 6,975,971 B2 | 12/2005 | Tang |
| 7,343,770 B2 * | 3/2008 | Barnoski ................ B21D 28/02 100/214 |
| 2012/0180542 A1 * | 7/2012 | Golovashchenko ... B21D 19/08 72/57 |

FOREIGN PATENT DOCUMENTS

| CN | 101714175 B | 5/2010 |
| CN | 103177138 A | 6/2013 |
| KR | 100664722 B | 1/2007 |

OTHER PUBLICATIONS

Adina Industries, Inc., "Forming", www.adina.com/industries.shtml, © Adina R & D, Inc. (8 pages).
Auto/Steel Partnership, http://www.a-sp.org/About%20A-SP, © 2014 Auto/Steel Partnership (3 pages).

* cited by examiner

*Primary Examiner* — Teresa M Ekiert
(74) *Attorney, Agent, or Firm* — Jason C. Rogers; Bejin Bieneman PLC

(57) ABSTRACT

A method of forming a hemming tool includes providing a computer generated model of a panel including a flange in an unhemmed position and of a hemming tool including a hemming surface. Hemming the flange with the hemming tool is virtually simulated in the computer generated model. At least one non-conformity is identified along the flange in the computer generated model after virtually simulating hemming. The computer generated model is then modified to a modified computer generated model by adjusting the flange to change the at least one defect. Hemming the flange in the unhemmed position with the hemming tool is then virtually simulated in the modified computer generated model in the modified computer generated model.

12 Claims, 11 Drawing Sheets

METHOD OF FORMING HEMMING TOOL

BACKGROUND

A vehicle includes exterior sub-assemblies including exterior panels that may be formed from metal, such as steel, and may be manufactured by various metalworking processes. Some components of the vehicle include an interior panel, typically formed of metal, and the exterior panel may be hemmed to the interior panel. For example, vehicle components such as doors, a hood, a deck lid, and a moon roof may each include the exterior panel hemmed to the interior panel. The interior panel may, for example, include attachment points for hoses, wires, etc., and may structurally reinforce the exterior panel.

To fabricate the exterior panel, a metal sheet blank may be formed by one or more stamping dies. For example, the blank may be moved between several stamping dies in a stamping line. The stamping line may include a draw die that shapes the blank, a trim die that trims exterior extra material from the periphery the panel, and a flanging die that forms a flange around at least a periphery of the panel.

After the flange is formed, a hemming operation hems the flange of the exterior panel around an edge of the interior panel. Specifically, the interior panel and the exterior panel are placed on a hem die and the flange is bent around the edge of the interior panel. For example, a pre-hem tool may bend the flange about the edge of the interior panel and a hemming tool may shape and compress the flange about the edge of the interior panel. This hemmed flange reinforces the edge of the exterior panel, hides burrs and rough edges, and provides an aesthetically pleasing appearance.

These various steps on the stamping line and the hemming die each contribute to the final shape of the sub-assembly. One or more of these steps, individually or in combination, affect the size, shape, and location of the flange. The size, shape, and location of the flange affects the gap size between two adjacent panels, e.g., the gap between a front door and a rear door of the vehicle. The aesthetic appearance of the vehicle may be negatively judged when these gaps are large. As such, it is beneficial to reduce the size of these gaps to render a more aesthetically pleasing appearance of the vehicle. Attempts to minimize the gap size between the panels are typically made by trial-and-error and each attempt is time consuming and costly. In addition, one change made during the trial-and-error process may inadvertently and undesirably change another feature of the panel.

In addition the various steps on the stamping line and the hemming die, individually or in combination, may cause non-conformities in the exterior panel, e.g., defects. For example, the hemmed flange is preferably smooth and the non-conformities may include wrinkling, cracking, creepage, creasing, etc., along the flange. Attempts to correct these non-conformities may be made by adjusting the dies in the stamping line and/or adjusting the pre-hem tool or the hemming tool. Such adjustments to the stamping line, the pre-hem tool, and/or the hemming tool are also typically made by trial-and-error and each attempt is time consuming and costly. As such, the fabrication of the dies in the stamping line, the pre-hem tool, and the hemming tool is costly and time consuming. Accordingly, there remains an opportunity to improve the fabrication of the stamping line, the pre-hem tool, and the hemming tool.

DETAILED DESCRIPTION

Figure 10:
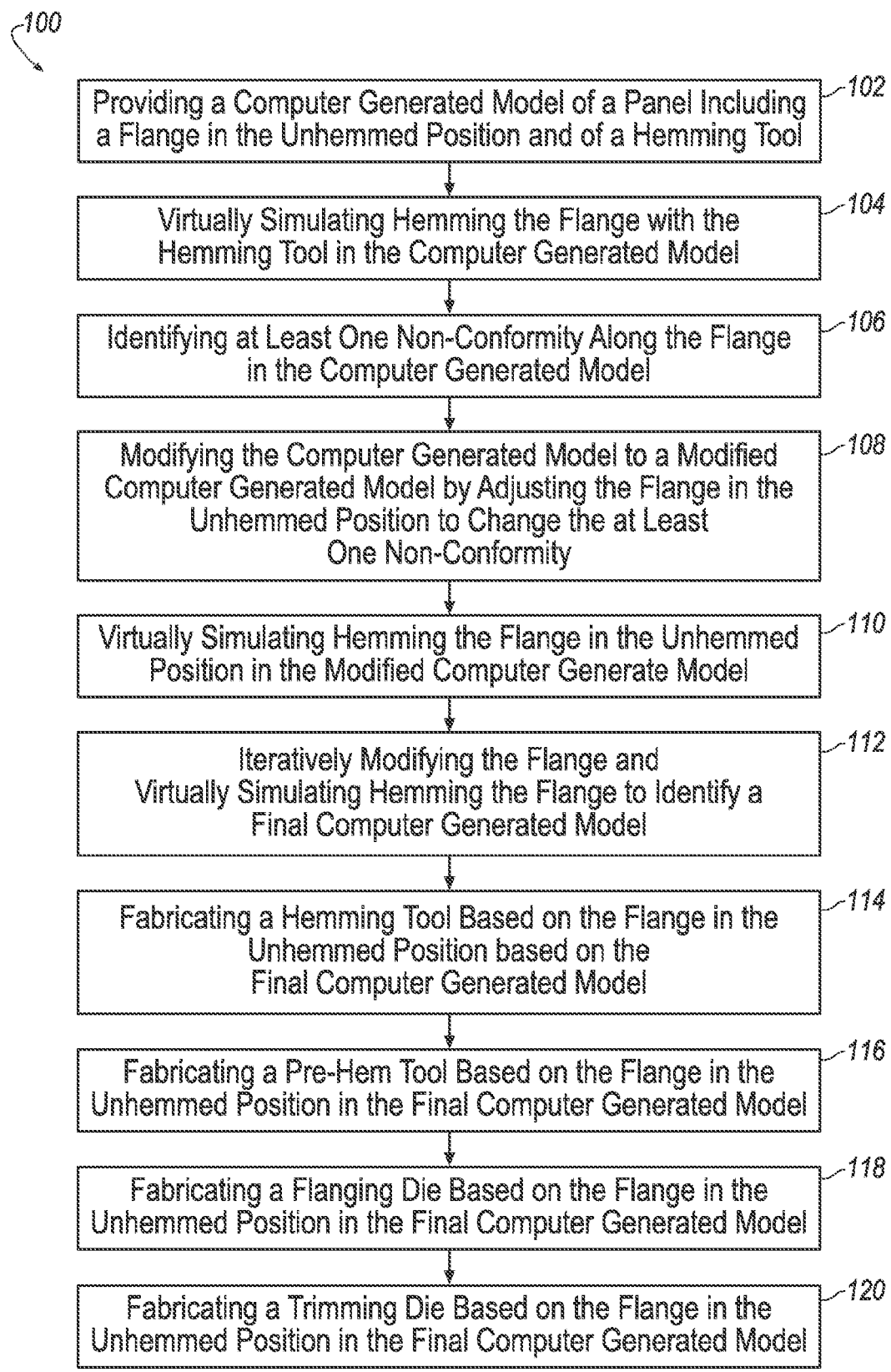
FIG. 10 is a flow chart of a method of forming the hemming tool.
Figure 11:
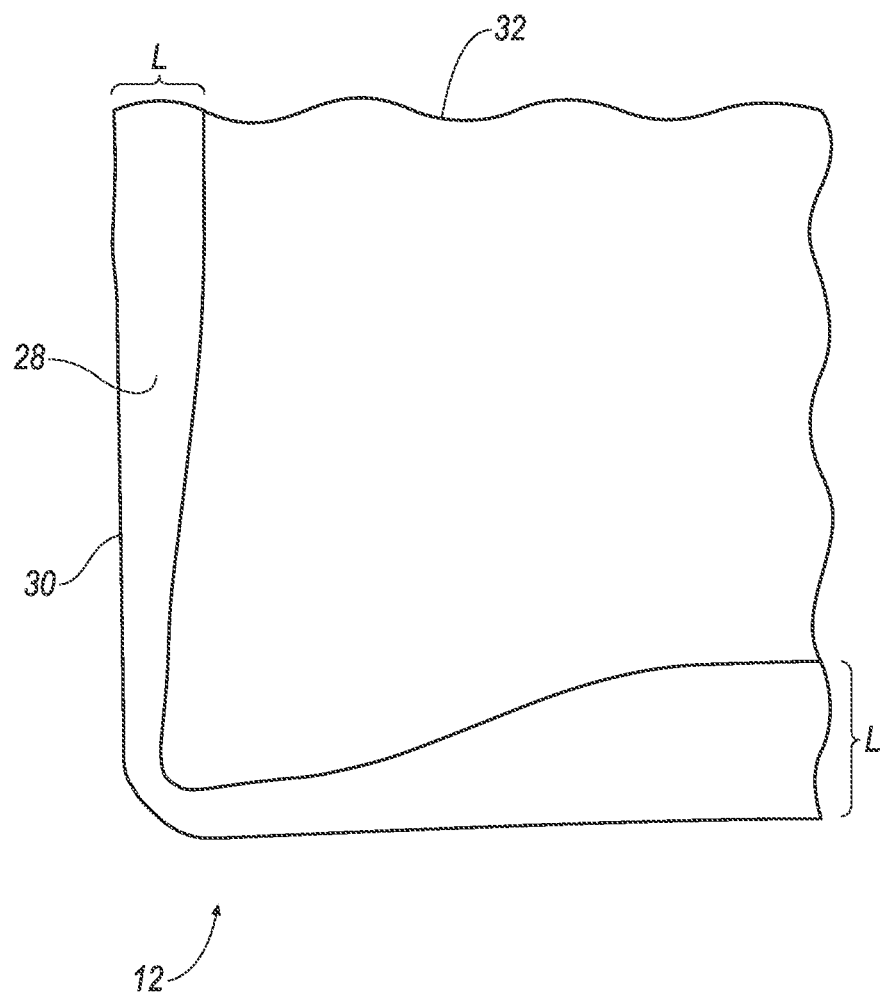
FIG. 11 is a screen-shot of the display of the computer displaying a computer-generated model of a portion of the exterior panel hemmed to the interior panel including adjusted flange length to avoid non-conformities.
Figure 12:
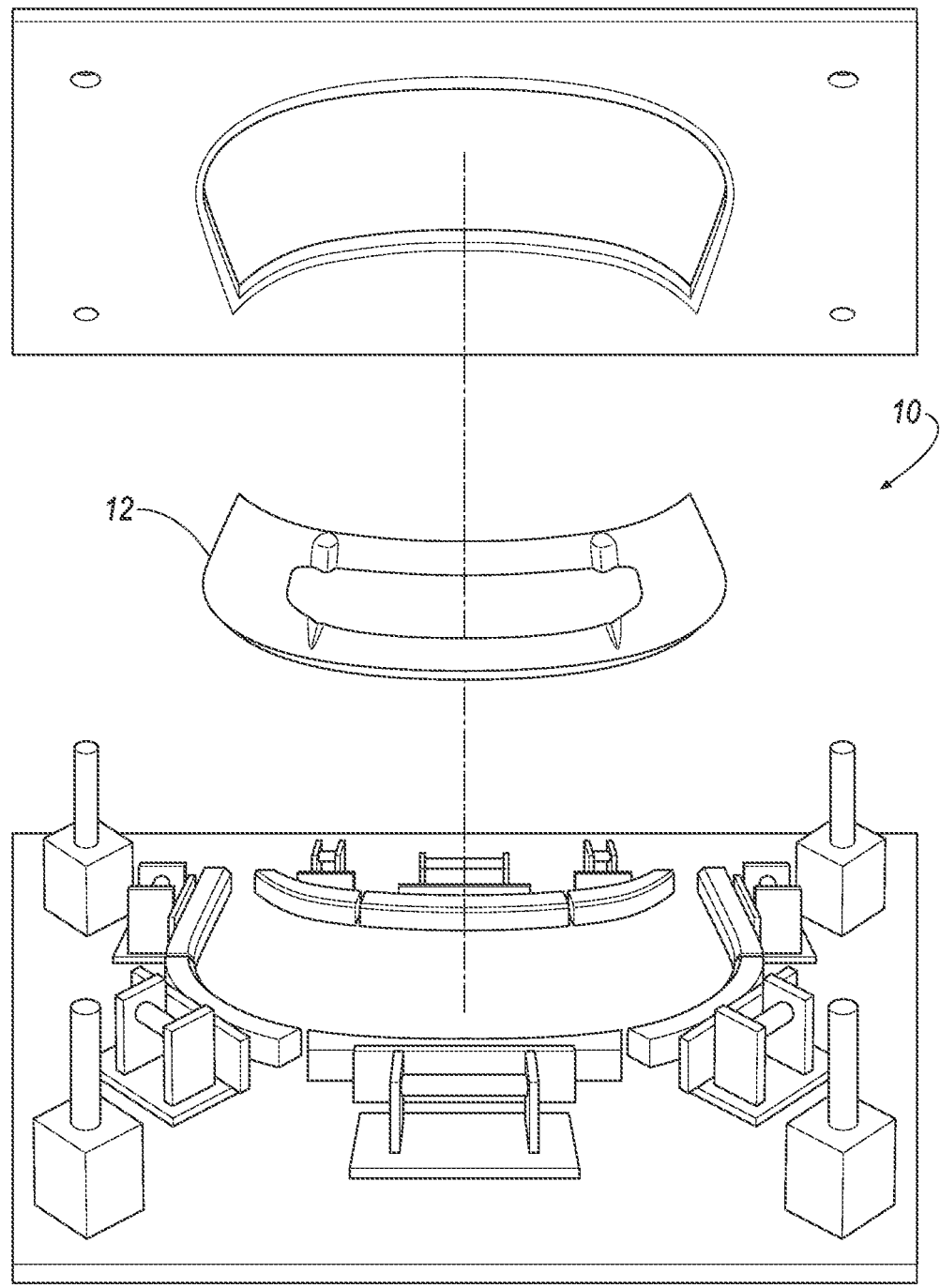
FIG. 12 is a perspective view of the hemming tool.

With reference to the Figures, wherein like numerals indicate like parts throughout the several views, a method 100 of forming a hemming tool 10 is disclosed. With reference to FIG. 10, the method includes providing a computer generated model of a panel 12, visually depicted on a display 14 of a computer in FIG. 3, including a flange 28 in an unhemmed position and of a hemming tool 10 including a hemming surface 20, as shown in block 102. The method includes virtually simulating hemming the flange 28 with the hemming tool 10 when the flange 28 is in the unhemmed position in the computer generated model as shown in block 104. The method next includes identifying at least one non-conformity 22, e.g., a defect, along the flange 28 in the computer generated model after virtually simulating hemming, as shown in block 106. The method next includes modifying the computer generated model to a modified computer generated model by adjusting the flange 28 to change the at least one non-conformity 22, as shown in block 108. The method includes virtually simulating hemming the flange 28 in the unhemmed position in the modified computer generated model with the hemming tool in the modified computer generated model, as shown in block 110.

Since the method virtually simulates hemming the flange 28 in the computer generated model, the non-conformities 22 along the flange 28 that may result from the hemming may be viewed virtually, i.e., on the computer generated model. These non-conformities 22 may then be addressed virtually, i.e., in the computer generated model, before a hemming tool 10, a pre-hem tool 44, a flanging die 54, a trim die 52, or a draw die 50 are fabricated. Specifically, the flange 28 in the computer generated model may be adjusted, i.e., the computer generated model is modified to be the modified computer generated model, to change the at least one non-conformity 22. The method then includes virtually simulating hemming the flange 28 in the modified computer generated model, i.e., including the adjusted flange 28, to confirm that the non-conformity 22 was corrected by the modification in the modified computer generated model. The adjustment to the flange 28 and the virtual simulation of hemming the adjusted flange 28 may be repeatedly performed such that the computer generated model of the flange 28 may be iteratively adjusted to determine optimum characteristics of the flange 28, e.g., shape, dimension, etc. When the optimum characteristics of the flange 28 are determined in a final computer generated model, the hemming tool 10, pre-hem tool 44, flanging die 54, trim die 52, and/or draw die 50 may be fabricated based on the flange 28 in the final computer generated model.

Since the flange 28 is modified in the computer generated model to correct the non-conformity 22, the flange 28 may be optimized in the modified computer generated model before the hemming tool 10, pre-hem tool 44, flanging die 54, trim die 52, and draw die 50 are fabricated. This limits or eliminates trial-and-error fabrication of the hemming tool 10, pre-hem tool 44, flanging die 54, trim die 52, and/or draw die 50, which reduces cost and time associated with reiterations of trial-and-error fabrication.

Figure 1:
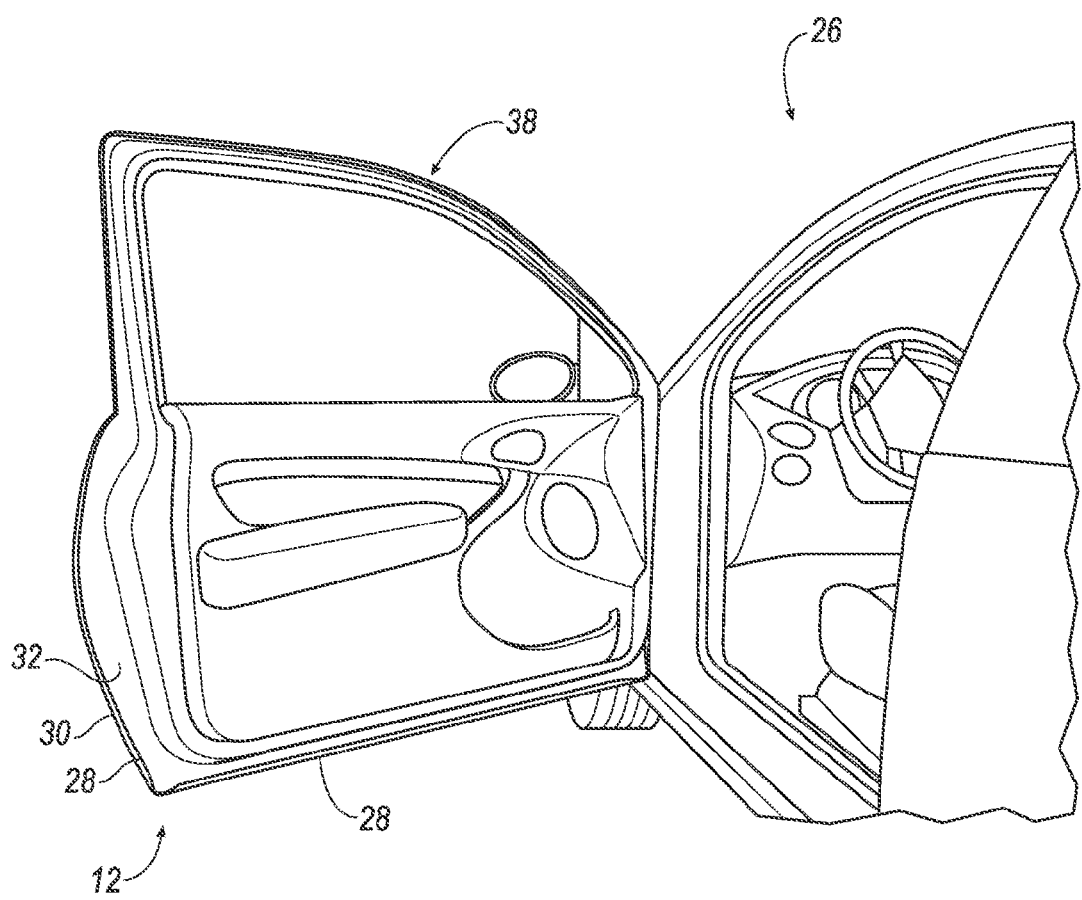
FIG. 1 is a perspective view of a vehicle with a door in an open position exposing a hemmed flange.

The hemming tool 10 may be operated to fabricate panels 12 for vehicles 26 that include hemmed flanges 28 as shown in FIG. 1. For example, the panels 12 may be exterior panels 30 (i.e., outer panels) formed from metal, such as steel. The panel 12 may include an interior panel 32 (i.e., inner panel), typically formed of metal, and the exterior panel 30 may be hemmed to the interior panel 32, as set forth further below. For example, the visual depiction of the computer generated model shown in FIG. 3 includes an exterior panel 30 and an interior panel 32 of the panel 12. The interior panel 32 of the panel 12 may, for example, include attachment points for hoses, wires, etc., and may structurally reinforce the exterior panel. Vehicle components such as, for example, doors 38, a hood (shown in FIG. 10), a deck lid, a moon roof, etc., may each include the exterior panel 30 hemmed to the interior panel 32. However, any suitable component of the vehicle 26 may be formed from a first panel hemmed to a second panel with the hemming tool.

Figure 2:
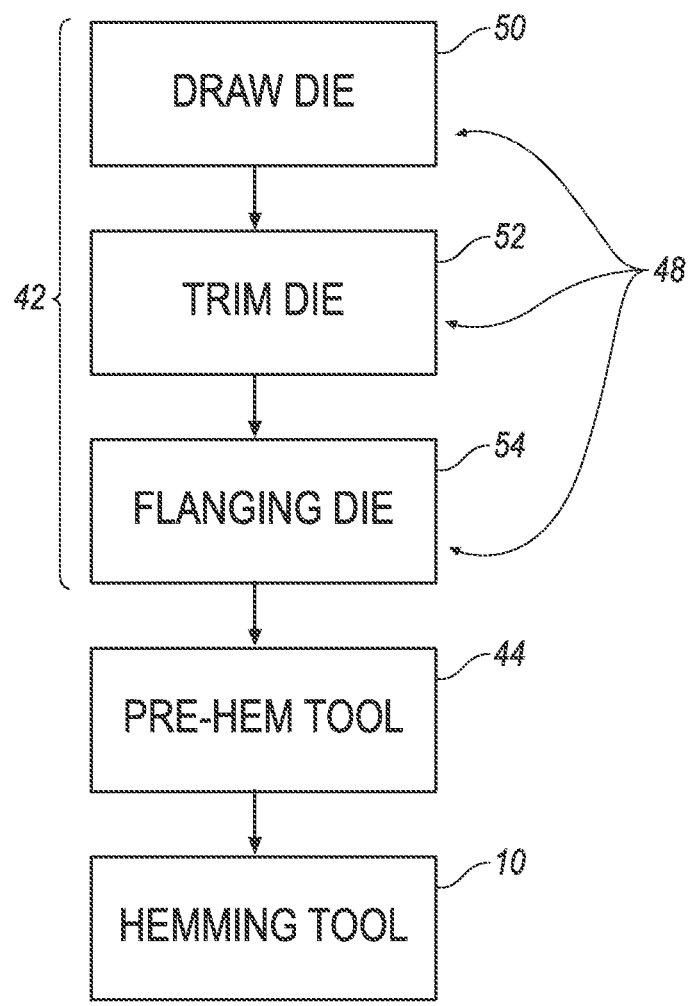
FIG. 2 is a schematic view of a stamping line, a pre-hem tool, and a hemming tool.
Figure 4:
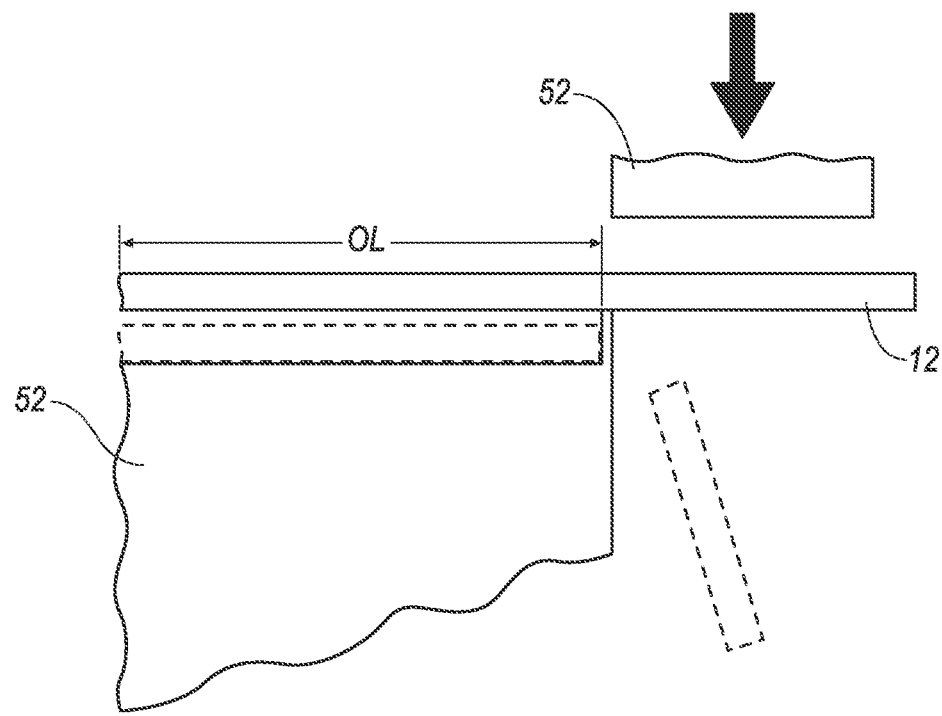
FIG. 4 is a side view of a trimming die trimming a blank.
Figure 5:
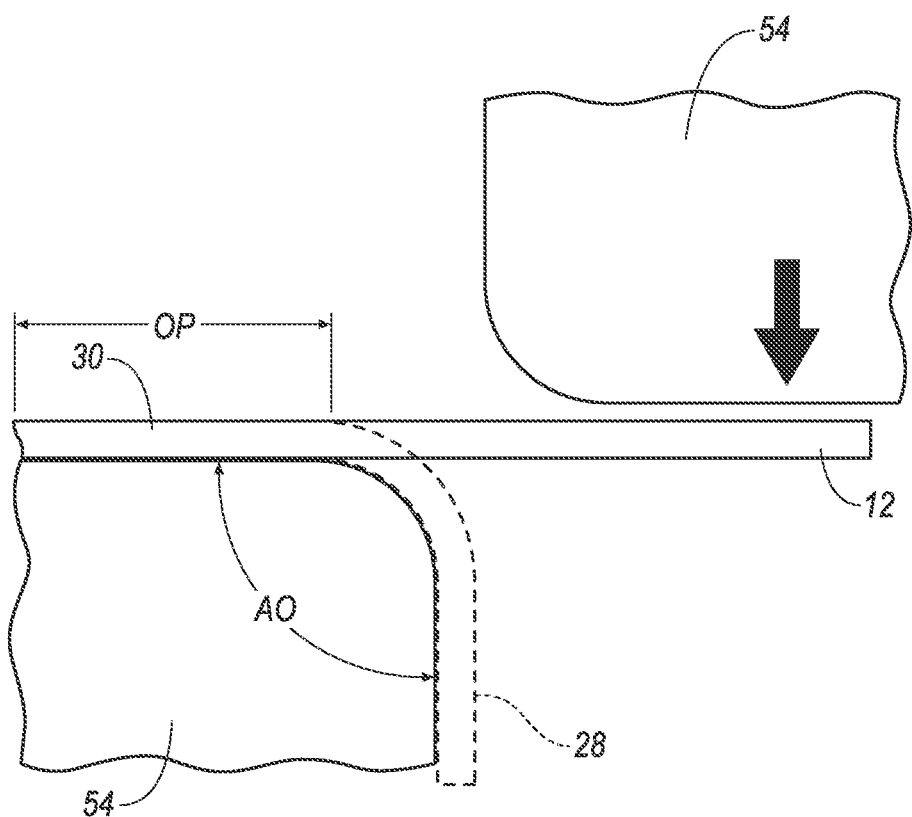
FIG. 5 is a side view of a flanging die forming a flange of an exterior panel.

FIG. 2 schematically shows a stamping line 42, a pre-hem tool 44, and a hemming tool 10. To fabricate the exterior panel 30, a sheet metal blank may be formed by one or more stamping dies 48 in the stamping line 42. The metal blank, for example, may be moved between several stamping dies 48 in the stamping line 42. The stamping dies 48 may include metal removing dies that remove metal from the metal blank, e.g., by trimming, piercing, etc., and may include metal forming dies that form the metal blank, e.g., by flanging, reforming, etc. The stamping line 42 may include a plurality of stamping dies 48, e.g., a draw die 50 that shapes the blank, a trim die 52 that trims extra material from the periphery the panel 12 (as also shown in FIG. 4), and a flanging die 54 that forms the flange 28 around at least a periphery of the panel 12 (as also shown in FIG. 5).

Figure 6:
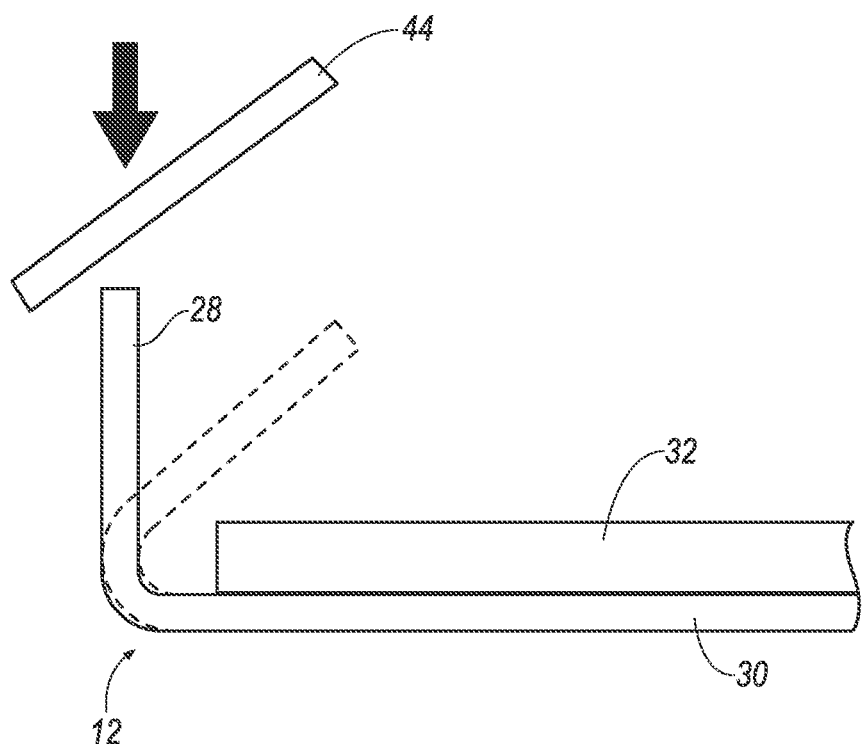
FIG. 6 is a side view of a pre-hem tool deforming the flange.

After the flange 28 is formed, a hemming operation hems the flange 28 of the exterior panel 30 around an edge of the interior panel 32. Specifically, the interior panel 32 and the exterior panel 30 are placed on the hemming tool 10 and the flange 28 is bent around the edge of the interior panel 32. For example, as shown in FIG. 6, the pre-hem tool 44 may bend the flange 28 about the edge of the interior panel 32 and a hemming tool 10 may shape and compress the flange 28 about the edge of the interior panel 32. This hemmed flange 28 reinforces the edge of the exterior panel 30, hides burrs and rough edges, and provides an aesthetically pleasing appearance. A sealant (not shown) may be disposed between the edge of the interior panel 32 and the flange 28 when the flange 28 is hemmed.

Figure 3:
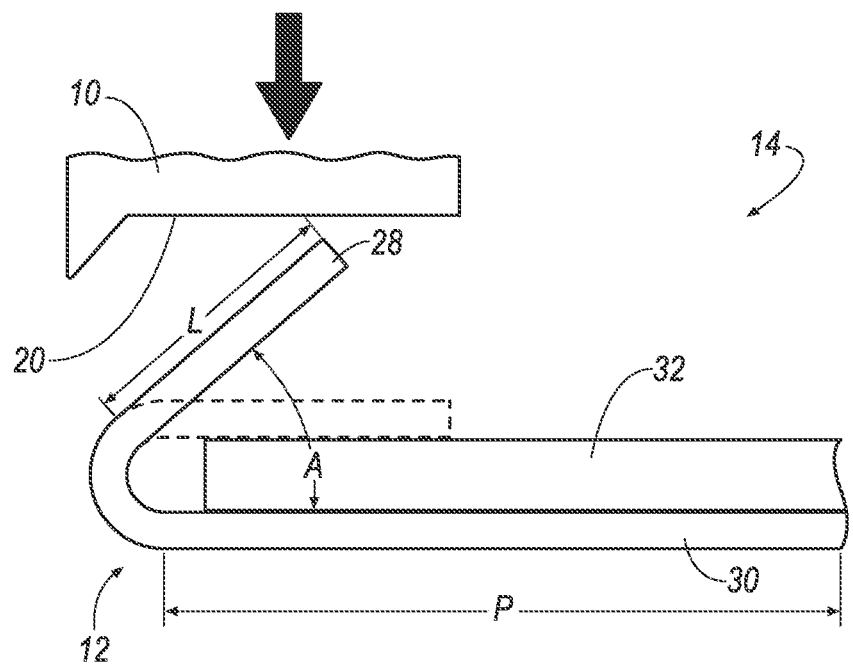
FIG. 3 is a screen-shot of the display of a computer displaying a computer-generated model of a hemming tool.

With reference to FIG. 3, the method includes providing a computer generated model to simulate the hemming process. Specifically, the method may include the use of a computer aided design (CAD) program, i.e., software, on a computer to store and access the computer generated model. A screen shot of a portion of the computer generated model is shown on the display 14 of the computer in FIG. 3. The numerals of panel 12 used above are used in FIG. 3 to identify the components of the computer generated model on display 14.

The computer generated model may be provided to the CAD program in any suitable way. For example, an operator of the CAD program may access one or more CAD files that store the computer generated model. The computer generated model may include geometric data representing the geometry of the panel 12, the stamping line 42, the pre-hem tool 44, and the hemming tool 10. In other words, the geometric data is a digital representation of the modeled components. In addition, the computer generated model may include material types, material properties, etc., of the modeled components.

The geometric data may be of any suitable type, such as CAD data. The CAD data may be for any type of modeling, such as wireframe modeling, surface modeling, solid modeling, etc. The CAD data may be of any suitable format. The CAD program may be any suitable program such as, for example, that available under the commercial name CATIA, AutoCAD, SolidWorks, etc.

Simulations on the computer generated model may be performed by computer aided engineering (CAE). The CAE simulations may virtually simulate relative movements and forces of components in the computer generated model to analyze the reaction of the components, e.g., relative movements, deformations, etc. The CAE simulations may include finite element analysis (FEA), multibody dynamics, etc.

The CAE simulations may be performed with a CAE program, i.e., software stored on the computer. The software may be the same program as the CAD program or may be a separate program and may be stored on the same computer as the CAD program or a separate computer. For example, the CAE program may be that available under the commercial name LS-Dyna, Autoform, Optris, etc. The CAD program may be that available under the commercial name Catia, AutoCAD, Solidworks, etc. The CAE program may directly use the CAD files of the CAD program, or may use files converted from the CAD files of the CAD program.

With reference to FIG. 10, the step of providing the computer generated model includes, as set forth above, providing the computer generated model of the panel 12 including the flange 28 in an unhemmed position, i.e., simulating a position of the flange 28 before being hemmed with the hemming tool 10. The computer generated model of the panel 12 including the flange 28 in an unhemmed position may be in an initial computer generated model of the panel 12 based on the desired appearance of the panel 12 and based on expertise in the art of fabricating panels, for example. This unhemmed position may be, for example, the position of the flange 28 after being stamped by the stamping line 42 and before being deformed by the pre-hem tool 44.

Figure 7:
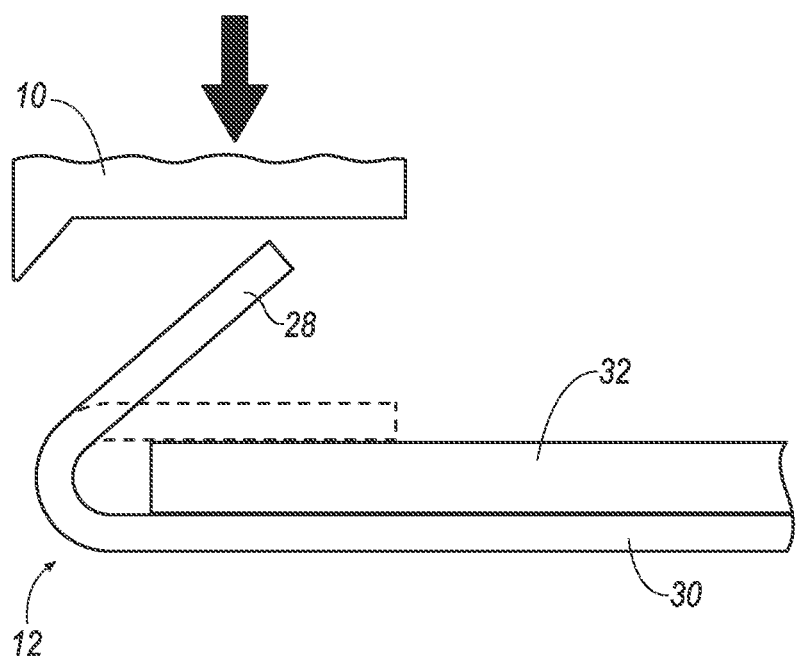
FIG. 7 is a side view of a hemming tool hemming the flange.
Figure 8:
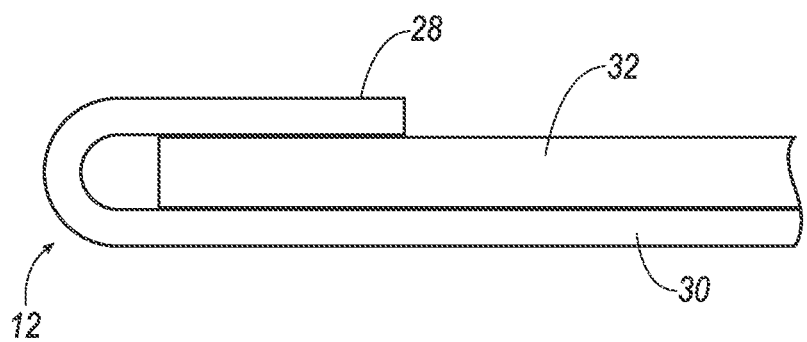
FIG. 8 is a side view of the exterior panel hemmed to an interior panel.
Figure 9A:
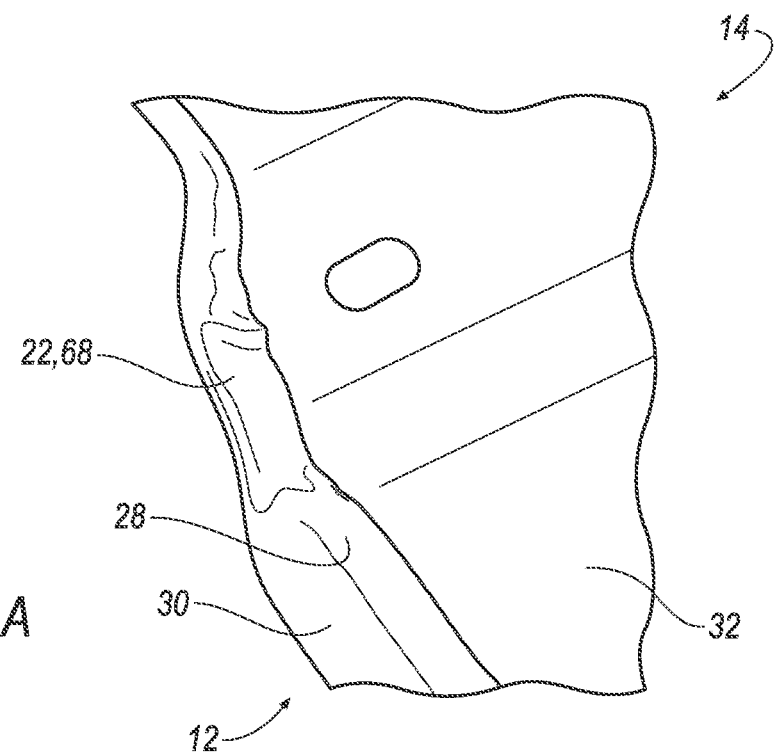
FIG. 9A is a screen-shot of the display of the computer displaying a computer-generated model of a panel including a wrinkle.
Figure 9B:
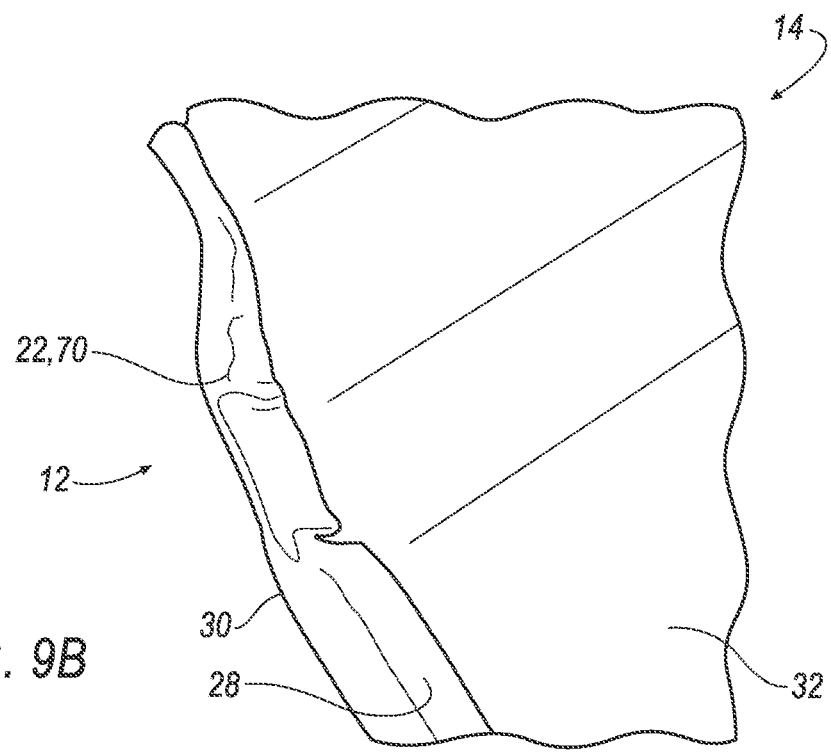
FIG. 9B is a screen-shot of the display of the computer displaying a computer-generated model of a panel including an edge crack.
Figure 9C:
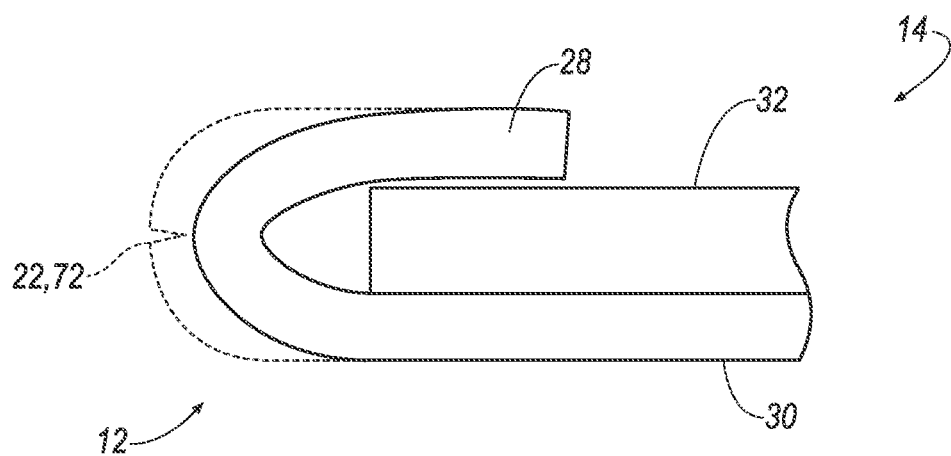
FIG. 9C is a screen-shot of the display of the computer displaying a computer-generated model of a panel including creepage.
Figure 9D:
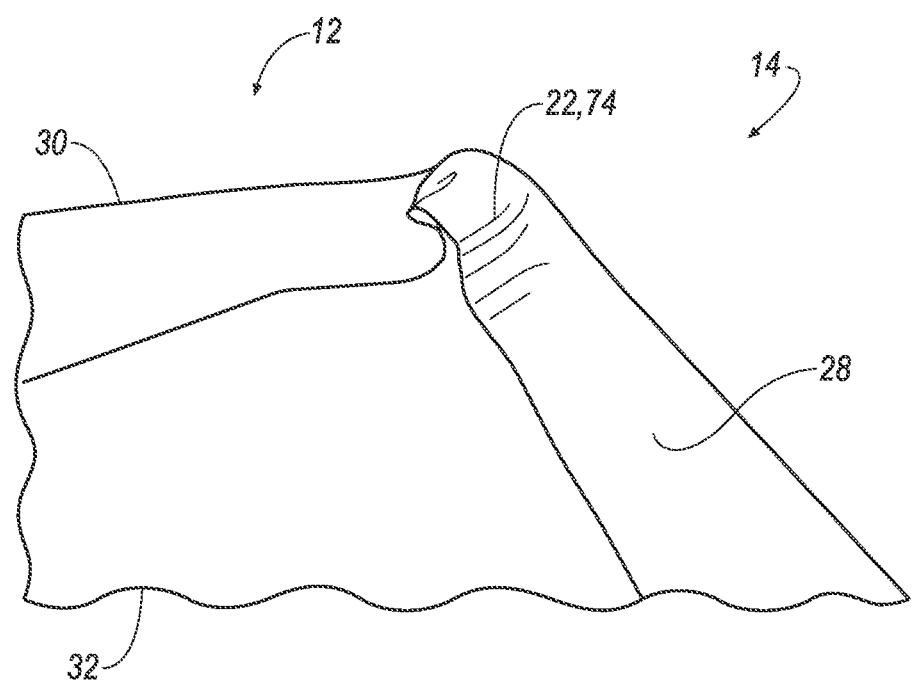
FIG. 9D is a screen screen-shot of the display of the computer displaying a computer-generated model of a panel including a crease.

The flange 28 is shown in unhemmed positions in FIGS. 5-7 and is shown in the hemmed position in FIGS. 1, 8-9D, and 11.

With continued reference to FIG. 3, as set forth above, the method may include providing the hemming tool 10 including a hemming surface 20 in the computer generated model, as shown in block 102 of FIG. 10. For example, the method may include designing the hemming surface 20 of the hemming tool 10 in the computer generated model based on an unhemmed position, e.g., the pre-hem position, of the flange 28 in the computer generated model. In other words, the hemming surface 20 is reverse engineered based on the dimensions and position of the flange 28 in the pre-hem position in the computer generated model. Characteristics of the hemming surface 20 such as shape, dimension, attack angle relative to the flange 28, etc., may be designed based on the position of the flange 28 in the pre-hem position in the computer generated model.

With reference to FIGS. 3 and 10, the method next includes virtually simulating hemming the flange 28 in an unhemmed position, e.g., the pre-hem position, with the hemming tool 10 in the computer generated model, e.g., with the use of the CAE program, as shown in block 104 of FIG. 10. Specifically, the CAE program simulates deforming the flange 28 from the pre-hem position to the hemmed position by simulating forcing the hemming surface 20 against the flange 28.

As shown in block 106 of FIG. 10, the method includes identifying at least one non-conformity 22 along the flange 28 in the computer generated model after the step of virtually simulating hemming. The non-conformity 22 may be identified manually by a human operator of the CAE program, e.g., by visual inspection of the model after the simulation. Alternatively, or additionally, the non-conformity 22 may be identified automatically by the CAE program.

The method includes modifying the computer generated model into a modified computer generated model by adjusting the flange 28 to change the non-conformity 22, as shown in block 108 of FIG. 10.

Adjusting the flange 28 may include adjusting a length L (FIG. 3) of the flange 28, an angle of the flange 28 relative to the hemming surface 20 and/or any other relevant dimension of the flange 28. In other words, the flange 28 in the computer generated model may be modified to create an adjusted flange 28 in an unhemmed position. The flange 28 in the computer generated model may be manually adjusted by the human operator of the CAE program and/or may be automatically adjusted by the CAE program.

In addition to, or in the alternative to adjusting the flange 28, the hemming surface 20 of the hemming tool 10 in the computer generated model may be modified to create an adjusted hemming surface in the modified computer generated model to change the non-conformity 22. A contour of the hemming surface 20, an angle of attack of the hemming surface 20 relative to the flange 28, and/or any other relevant dimension of the hemming surface 20 may be adjusted in the computer generated model to change the non-conformity 22. The hemming surface 20 in the computer generated model may be manually adjusted by the human operator of the CAE program. Alternatively, the hemming surface 20 may be automatically adjusted by the CAE program or the CAD program.

The step of hemming the flange 28 is simulated again for the modified computer generated model. Specifically, the method includes virtually simulating hemming the modified flange 28 in an unhemmed position in the modified computer generated model with the hemming tool 10 in the modified computer generated model, as shown in block 110.

The steps of virtually simulating the hemming process and identifying non-conformities 22 along the flange 28 may be iteratively performed, as shown in block 112 of FIG. 10. In other words, the flange 28 may be repeatedly modified in several modified computer generated models and the hemming may be virtually simulated after each modification to optimize the computer generated model. Specifically, the method next includes reviewing the flange 28 on the modified computer generated model after the step of virtually simulating hemming on the modified computer generated model. The method may include identifying at least one non-conformity along the flange 28 in the modified computer generated model after the step of virtually simulating hemming on the modified computer generated model.

After one or more iterations of modifying the computer generated model and adjusting the computer generated model to change non-conformities along the flange 28 in the hemmed position, the flange 28 in the hemmed position may be optimized to decrease or eliminate non-conformities. At this point, the modified computer generated model is labeled as a final computer generated model.

The method may include fabricating the hemming tool 10 based on the flange 28 in the unhemmed position based on the final computer generated model, as shown in block 114 of FIG. 10. Specifically, as shown in FIG. 3, the hemming tool 10 in the computer generated model includes a hemming surface 20 and the step of modifying the computer generated model may include adjusting the hemming surface 20. The hemming tool 10 may be fabricated to include the hemming surface 20 of the final computer generated model.

The method may include fabricating the pre-hem tool 44 based on the flange 28 in the unhemmed position, i.e., the unhemmed flange 28, in the modified computer generated model, e.g., the final computer generated model. Specifically, for example, the flange 28 in the unhemmed position in the modified computer generated model, e.g., the final computer generated model, includes a pre-hem flange angle A, as shown in FIG. 3. The step of fabricating the pre-hem tool 44 includes fabricating a surface of the pre-hem tool 44 configured to deform the flange 28 on the panel 30 to have the pre-hem flange angle A of the final computer generated model. As another example, the flange 28 in the unhemmed position in the modified computer generated model, e.g., the final computer generated model, includes a pre-hem flange bend position P, as shown in FIG. 3. The step of fabricating the pre-hem tool 44 includes fabricating a surface of the pre-hem tool 44 configured to deform the flange 28 on the panel 30 to have the pre-hem flange bend position P.

The method may include fabricating the stamping line 42 based on the flange 28 in the unhemmed position in the modified computer generated model, e.g., the final computer generated model. For example, the method may include fabricating the flanging die 54 based on the flange 28 in the unhemmed position in the modified computer generated model, as shown in block 118. Specifically, the method may include determining an original flange angle OA, as shown in FIG. 5, based on the flange 28 in the unhemmed position in the modified computer generated model, e.g., the final computer generated model. The method may include fabricating a surface of the flanging die 54 configured to deform the flange 28 on the panel 30 having the original flange angle OA. As another example, the method may include determining an original flange bend position OP, as shown in FIG. 5, based on the flange 28 in the unhemmed position in the modified computer generated model. The method may include fabricating a surface of the flanging die 54 configured to deform the flange 28 on the panel 30 to have the original flange position OP.

As another example, as shown in block 120 of FIG. 10, the method may include fabricating the trim die 52 based on the flange 28 in the unhemmed position in the modified computer generated model, e.g., the final computer generated model. For example, the method may include determining an original flange length OL based on the flange 28 in the unhemmed position in the modified computer generated model. The method may include fabricating a surface of the trim die 52 configured to trim the panel 30 to include a flange 28 having the original flange length OL.

The computer generated model may, for example, include a computer generated model of the stamping line 42 including one or more stamping dies 48. Specifically, the method may include providing a model (not shown) of the stamping die 48, e.g., the flanging die 54, including a stamping surface in the computer generated model. For example, the method may include designing the stamping surface of the stamping die 48 in the computer generated model based on an unhemmed position, e.g., the stamped position, of the flange 28 in the final computer generated model. In other words, the stamping surface is reverse engineered based on the dimensions and position of the flange 28 in an unhemmed position in the final computer generated model.

The method may include providing a model of the pre-hem tool 44 including a pre-hem surface, which contacts the flange 28 during a pre-hem operation, in the computer generated model. For example, the method may include designing the model to include the pre-hem surface of the pre-hem tool 44 in the computer generated model based on an unhemmed position, e.g., the stamped position, of the flange 28 in the final computer generated model. In other words, the pre-hem surface may be reverse engineered based on the dimensions and position of the flange 28 in the unhemmed position in the final computer generated model. Characteristics of the pre-hem surface such as shape, dimension, attack angle relative to the flange 28, etc., may be designed based on the position of the flange 28 in the unhemmed position in the final computer generated model. As set forth below, the CAE program may virtually simulate deformation of the flange 28 from the stamped position to another unhemmed position, namely a pre-hem position.

The method may include virtually simulating forming the flange 28 in an unhemmed position with a model of the stamping die 48 with the CAE program. For example, the method may include virtually simulating forming the flange 28 in the unhemmed position with the model of the stamping die 48, e.g., the flanging die 54. The method may include virtually simulating forming the flange 28 in the stamped position by moving the sheet metal blank through the models of the draw die 50, the trim die 52, and the flanging die 54 in the computer generated model.

The method may include virtually simulating deforming the flange 28 from an unhemmed position, e.g., the stamped position, toward the hemmed position, e.g., to the pre-hem position, with the model of the pre-hem tool 44 in the computer generated model. For example, this simulation may be conducted with the CAE program. Specifically, the CAE program simulates deforming the flange 28 by forcing the pre-hem surface of the pre-hem tool 44 against the flange 28.

The simulations of forming the flange 28 with the models of the stamping dies 48, deforming the flange 28 with the model of the pre-hem tool 44, and hemming the flange 28 with the model of the hemming tool 10 may each be performed in a single simulation of in separate simulations with the use of the CAE program. These simulations may be stopped at any point in time to analyze the relative positions, stresses, deformations, etc., of each component of the model.

The method may include adjusting the model of the stamping surface of the stamping dies 48, e.g., the flanging die 54, of the computer generated model in the modified computer generated model to change the non-conformity 22. In other words, the stamping surface in the computer generated model may be modified to create an adjusted stamping surface. The stamping surface in the computer generated model may be manually adjusted by the human operator of the CAE program and/or may be automatically adjusted by the CAE program.

The method may include adjusting the model of the pre-hem surface of the pre-hem tool 44 of the computer generated model in the modified computer generated model to change the at least one non-conformity 22. In other words, the pre-hem surface in the computer generated model may be modified to create an adjusted pre-hem surface. The pre-hem surface in the computer generated model may be manually adjusted by the human operator of the CAE program and/or may be automatically adjusted by the CAE program.

The adjustment of the model of the hemming surface 20 of the model of the hemming tool 10, the flange 28, the stamping surface of the stamping die 48, and/or the pre-hem surface of the pre-hem tool 44 in the computer generated model may be made simultaneously or separately. The modified computer generated model is generated to correct the non-conformities 22 along the hemmed flange 28 identified as a result of the virtual simulation of the hemming.

The various steps of the simulations each contribute to the final shape of the flange 28 in the hemmed position. One or more of these steps, individually or in combination, may cause non-conformities 22 along the flange 28 in the hemmed position. The non-conformities 22 may include wrinkling 68 (FIG. 9A), cracking 70 (FIG. 9B), creepage 72 (FIG. 9C), creasing 74 (FIG. 9D), etc., along the flange 28.

Specifically, the flange 28 in the modified computer generated model may be formed by virtually simulating forming the flange 28 with the model of the stamping die 48, e.g., with the adjusted stamping surface, in the modified computer generated model, virtually simulating deforming the flange 28 with the model of the pre-hem tool 44, e.g., with the adjusted pre-hem surface, in the modified computer generated model, and/or virtually simulating hemming the flange 28 with the hemming tool 10, e.g., with the adjusted hemming surface, in the computer generated model.

The method may include fabricating tools from the modified computer generated model, e.g., the final computer generated model. In other words, physical tools used to fabricate a physical panel 12 are fabricated to match the surfaces of the final computer generated model. For example, the method includes fabricating the hemming tool 10 to include a hemming surface corresponding to the hemming surface 20 of the modified computer generated model, fabricating the stamping die 48 to include a stamping surface corresponding to the stamping surface of the modified computer generated model, and fabricating the pre-hem tool 44 to include a pre-hem surface corresponding to the pre-hem surface of the modified computer generated model.

The disclosure has been described in an illustrative manner, and it is to be understood that the terminology which has been used is intended to be in the nature of words of description rather than of limitation. Many modifications and variations of the present disclosure are possible in light of the above teachings, and the disclosure may be practiced otherwise than as specifically described.

What is claimed is:

1. A method of forming a hemming tool, the method comprising:
   providing a computer generated model of a panel including a flange in an unhemmed position and of a hemming tool;
   virtually simulating hemming the flange in the unhemmed position with the hemming tool in the computer generated model;
   identifying at least one non-conformity along the flange in the computer generated model after virtually simulating hemming;
   modifying the computer generated model to a modified computer generated model by adjusting the flange to change the at least one non-conformity;
   virtually simulating hemming the flange in the unhemmed position in the modified computer generated model with the hemming tool in the modified computer generated model; and
   wherein the hemming tool in the computer generated model includes a hemming surface and wherein modifying the computer generated model includes adjusting the hemming surface based on the flange in the modified computer generated model, and further comprising fabricating the hemming tool to include the hemming surface of the modified computer generated model.

2. The method as set forth in claim 1 further comprising fabricating a pre-hem tool based on the unhemmed flange in the modified computer generated model.

3. The method as set forth in claim 2 wherein the flange in the unhemmed position in the modified computer generated model includes a pre-hem flange angle and wherein fabricating the pre-hem tool includes fabricating a surface of the pre-hem tool configured to deform a flange on a panel having the pre-hem flange angle.

4. The method as set forth in 2 wherein the flange in the unhemmed position in the modified computer generated model includes a pre-hem flange bend position and wherein fabricating the pre-hem tool includes fabricating a surface of the pre-hem tool configured to deform a flange on a panel at the pre-hem flange bend position.

5. The method as set forth in claim 1 further comprising fabricating a flanging die based on the unhemmed flange in the modified computer generated model.

6. The method as set forth in claim 5 further comprising determining an original flange angle based on the flange in the unhemmed position in the modified computer generated model and further comprising fabricating a surface of the flanging die configured to deform a flange on a panel having the original flange angle.

7. The method as set forth in claim 5 further comprising determining an original flange bend position and wherein fabricating the flanging die includes fabricating a surface of the flanging die configured to deform a flange on a panel at the original flange bend position.

8. The method as set forth in claim 1 further comprising fabricating a trimming die based on the unhemmed flange in the modified computer generated model.

9. The method as set forth in claim 8 further comprising determining an original flange length based on the unhemmed flange in the modified computer generated model and further comprising fabricating a surface of the trimming die configured to trim a panel to include a flange having the original flange length.

10. The method as set forth in claim 1 wherein the at least one non-conformity includes at least one of wrinkling, cracking, splitting, creeping, and creasing.

11. The method as set forth in claim 1 wherein adjusting the hemming surface includes adjusting at least one of a contour of the hemming surface and an angle of attack of the hemming surface relative to the flange.

12. The method as set forth in claim 1 wherein adjusting the flange includes adjusting at least one of a length of the flange and an angle of the flange relative to the hemming surface.

* * * * *